United States Patent
Kabelitz et al.

(10) Patent No.: US 11,292,085 B2
(45) Date of Patent: Apr. 5, 2022

(54) METHOD FOR WORKING A FIRST COMPONENT AND A SECOND COMPONENT BY LASER WELDING AND CORRESPONDING DEVICE

(71) Applicant: Webasto SE, Stockdorf (DE)

(72) Inventors: Thorsten Kabelitz, Stockdorf (DE); Jürgen Lipp, Stockdorf (DE); Andreas Schmidmayer, Stockdorf (DE); Fritz Wegener, Stockdorf (DE); Achim Holzwarth, Stockdorf (DE); Stephan Buckl, Stockdorf (DE); Tino Klinkmüller, Stockdorf (DE); Andreas Reuter, Stockdorf (DE); Karl Göttl, Stockdorf (DE); Daniel Eckert, Stockdorf (DE)

(73) Assignee: WEBASTO SE, Stockdorf (DE)

( * ) Notice: Subject to any disclaimer, the term of this patent is extended or adjusted under 35 U.S.C. 154(b) by 446 days.

(21) Appl. No.: 15/523,912

(22) PCT Filed: Nov. 9, 2015

(86) PCT No.: PCT/EP2015/076067
§ 371 (c)(1),
(2) Date: May 2, 2017

(87) PCT Pub. No.: WO2016/071533
PCT Pub. Date: May 12, 2016

(65) Prior Publication Data
US 2017/0312853 A1    Nov. 2, 2017

(30) Foreign Application Priority Data
Nov. 7, 2014    (DE) .................. 10 2014 116 283.8

(51) Int. Cl.
*B23K 26/00*    (2014.01)
*H05B 3/08*    (2006.01)
(Continued)

(52) U.S. Cl.
CPC ............ *B23K 26/244* (2015.10); *B23K 26/22* (2013.01); *B23K 26/32* (2013.01); *B23K 26/322* (2013.01);
(Continued)

(58) Field of Classification Search
CPC ............ B23K 2101/34; B23K 2101/42; B23K 2103/12; B23K 2103/172; B23K 26/22;
(Continued)

(56) References Cited

U.S. PATENT DOCUMENTS

| 2,600,485 A | 6/1952 | Cox |
| 2,644,066 A * | 6/1953 | Glynn ..................... H05B 3/84 338/308 |

(Continued)

FOREIGN PATENT DOCUMENTS

| CN | 1633346 A | 6/2005 |
| CN | 101009235 A | 8/2007 |

(Continued)

OTHER PUBLICATIONS

Laser Welding; pp. 1-5; https://www.trumpf.com/en_INT/applications/laser-welding/?=1.
(Continued)

*Primary Examiner* — Sang Y Paik
(74) *Attorney, Agent, or Firm* — Fitch, Even, Tabin & Flannery, LLP

(57) ABSTRACT

A method for working a first component and a second component comprises the following steps: providing the first component, which comprises a thermally sprayed electrically conductive layer, providing the second component,
(Continued)

Figure 1:
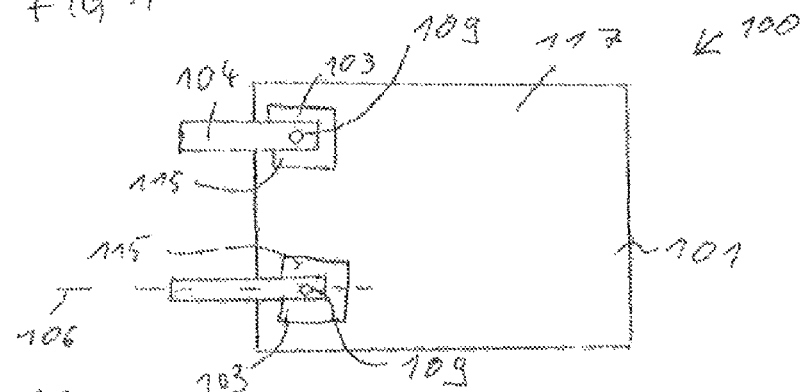

which has a longitudinally extended strip of copper, which at least in a first region has a thickness transversely to the longitudinal direction of more than 0.1 millimeter, arranging the strip and the layer one on top of the other, so that the first region of the strip and the layer have a contact region in common with one another, emitting a laser beam onto the contact region and forming a welded connection, which connects the strip and the layer to one another.

15 Claims, 2 Drawing Sheets

(51) Int. Cl.
| | |
|---|---|
| *B23K 26/244* | (2014.01) |
| *B23K 26/22* | (2006.01) |
| *H01R 4/02* | (2006.01) |
| *H01R 43/02* | (2006.01) |
| *H05K 3/32* | (2006.01) |
| *B23K 26/32* | (2014.01) |
| *B23K 26/323* | (2014.01) |
| *B23K 26/322* | (2014.01) |
| *H05K 1/18* | (2006.01) |
| *H05K 3/14* | (2006.01) |
| *B23K 101/34* | (2006.01) |
| *B23K 101/42* | (2006.01) |
| *B23K 103/12* | (2006.01) |
| *B23K 103/16* | (2006.01) |

(52) U.S. Cl.
CPC ........... *B23K 26/323* (2015.10); *H01R 4/029* (2013.01); *H01R 43/0221* (2013.01); *H05K 1/18* (2013.01); *H05K 3/14* (2013.01); *H05K 3/328* (2013.01); *B23K 2101/34* (2018.08); *B23K 2101/42* (2018.08); *B23K 2103/12* (2018.08); *B23K 2103/172* (2018.08); *H05K 2203/107* (2013.01)

(58) Field of Classification Search
CPC .... B23K 26/244; B23K 26/32; B23K 26/322; B23K 26/323; H01R 43/0221; H01R 4/029; H05K 1/18; H05K 2203/107; H05K 3/14; H05K 3/328
USPC ........................ 219/121.6–121.86, 538–546
See application file for complete search history.

(56) References Cited

U.S. PATENT DOCUMENTS

| | | | |
|---|---|---|---|
| 4,251,316 A | 2/1981 | Smallbone | |
| 4,450,346 A * | 5/1984 | Boaz ...................... | H05B 3/84 219/203 |
| 4,879,449 A * | 11/1989 | Duley .................. | B23Q 35/128 219/121.6 |
| 5,304,784 A * | 4/1994 | Tagashira ........... | G03G 15/2003 219/543 |
| 5,498,850 A * | 3/1996 | Das ...................... | A24F 47/008 219/121.66 |
| 7,772,031 B2 | 8/2010 | Tanka et al. | |
| 8,544,942 B2 | 10/2013 | Lazanja et al. | |
| 8,702,164 B2 | 4/2014 | Lazanja et al. | |
| 9,061,656 B2 | 6/2015 | Royer et al. | |
| 9,196,949 B2 | 11/2015 | Droste et al. | |
| 9,657,963 B2 | 5/2017 | Lazanja et al. | |
| 9,900,932 B2 | 2/2018 | Degen et al. | |
| 2002/0079296 A1 | 6/2002 | Dijken et al. | |
| 2005/0199610 A1* | 9/2005 | Ptasienski ................ | H05B 3/26 219/543 |
| 2007/0172980 A1 | 7/2007 | Tanaka et al. | |
| 2007/0199926 A1* | 8/2007 | Watanabe .......... | H01R 43/0221 219/121.64 |
| 2009/0236321 A1* | 9/2009 | Hayashi ................ | H01R 4/029 219/121.64 |
| 2009/0277671 A1 | 11/2009 | Hahn | |
| 2011/0081229 A1 | 4/2011 | Kottilingam et al. | |
| 2012/0024832 A1* | 2/2012 | Eck ...................... | B23K 26/046 219/121.75 |
| 2012/0055909 A1 | 3/2012 | Miyake et al. | |
| 2013/0277352 A1 | 10/2013 | Degen et al. | |
| 2016/0381788 A1* | 12/2016 | Petitgas ............... | H05K 1/0263 174/250 |

FOREIGN PATENT DOCUMENTS

| | | |
|---|---|---|
| CN | 102427909 A | 4/2012 |
| CN | 102473995 A | 5/2012 |
| CN | 202841573 U | 3/2013 |
| CN | 103202095 A | 7/2013 |
| CN | 103477706 A | 12/2013 |
| DE | 43 30 975 A1 | 3/1995 |
| DE | 4330975 A1 | 3/1995 |
| DE | 10 2006 017 675 A1 | 10/2007 |
| DE | 10 2014 004 433 A1 | 10/2014 |
| DE | 102014004433 A1 | 10/2014 |
| EP | 0572340 A1 | 12/1993 |
| EP | 0 887 884 A2 | 12/1998 |
| FR | 2 371 116 A1 | 6/1978 |
| FR | 2371116 A1 | 6/1978 |
| JP | S53062539 U | 5/1978 |
| JP | H07 94845 A | 4/1995 |
| JP | H0794845 A | 4/1995 |
| JP | H11 215652 A | 8/1999 |
| JP | H11215652 A | 8/1999 |
| JP | 2003123947 A | 4/2003 |
| JP | 2010500703 A | 1/2010 |
| JP | 4924771 B2 | 2/2012 |
| JP | 2013531335 A | 8/2013 |
| JP | 2014502408 A | 1/2014 |
| JP | 2002015837 A | 1/2018 |
| KR | 10-2012-0009510 A | 2/2012 |
| WO | 2011149680 A1 | 12/2011 |
| WO | 2012066112 A1 | 5/2012 |

OTHER PUBLICATIONS

Laser Welding; https://www.rofin.com/en/applications/laser-welding/.
Easy Welding of Copper with Laser Beam; p. 2, Apr. 2013 ISF Welding and Joining Institute Rwthaachen University; Dr-Ing. S. Olschok, Dipl.-Ing. S. Jakobs; pp. 1-4.
International Search Report for PCT/EP2015/076067 dated Mar. 4, 2016; English translation submitted herewith (8 pages).
Examination Report issued against corresponding Japanese Application JP2017-523836 dated May 8, 2018.
International Search Report for PCT/EP2016/076150 dated Feb. 8, 2017 and English translation submitted herewith (7 Pages).
"Easy Welding of Copper with Laser Beam" Dr. Ing S. Olschok et al., ISF; Direkt 47, Apr. 2013, p. 2.
Office Action for Korean Patent Application No. 10-2017-7012274; English translation; dated Oct. 29, 2019.
First Office Action issued against corresponding Chinese Patent Application No. 201680065569.3, dated May 22, 2020, in Chinese (8 pages).

* cited by examiner

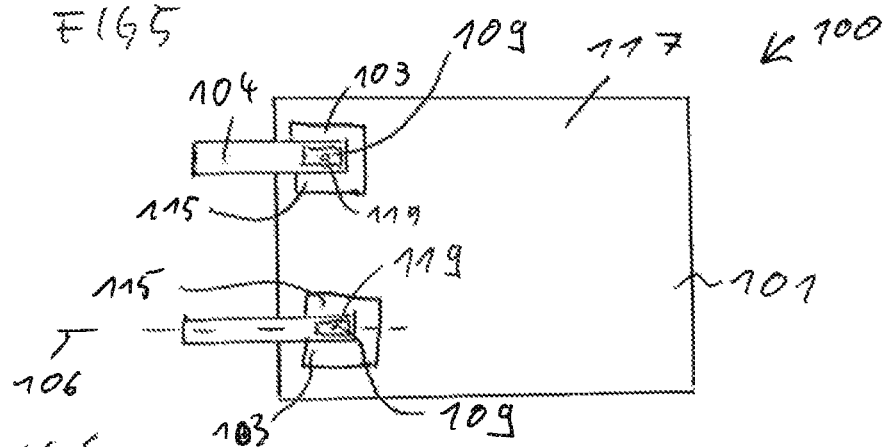
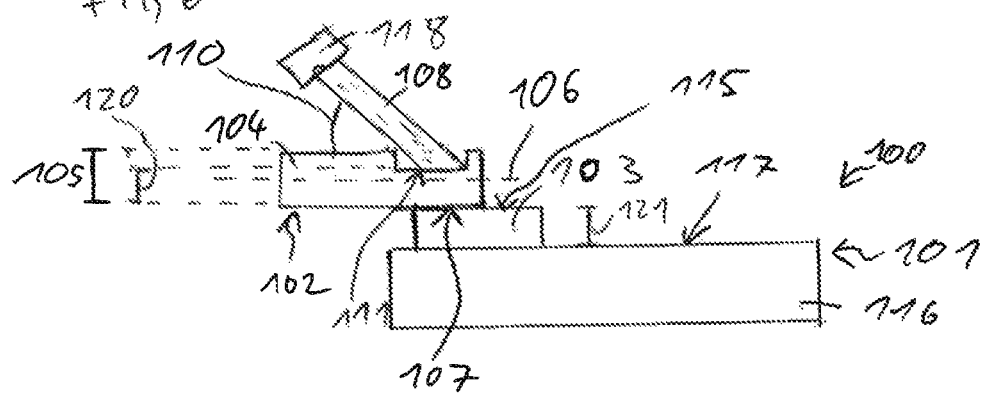
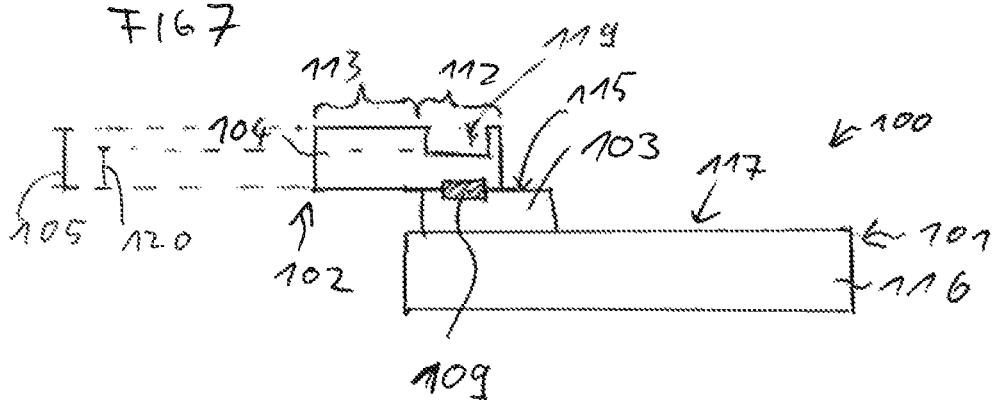

METHOD FOR WORKING A FIRST COMPONENT AND A SECOND COMPONENT BY LASER WELDING AND CORRESPONDING DEVICE

CROSS-REFERENCE TO RELATED APPLICATIONS

This application is a U.S. national phase application filed under 35 U.S.C. § 371 of International Application No. PCT/EP2015/076067, filed Nov. 9, 2015, designating the United States, which claims priority from German Application No. 10 2014 116 283.8, filed Nov. 7, 2014, which are hereby incorporated herein by reference in their entirety for all purposes.

FIELD

There are various contacting methods for connecting components, such as soldering, microresistance welding and laser beam welding. These contacting methods can be used for example to establish mechanical connections and/or electrically conductive connections. Laser beam welding is used for example for joining two solid materials in order to connect them with a material bond. Laser beam welding is industrially used especially for materials such as high-grade steel that are in particular not very reflective.

BACKGROUND

It is desirable to provide a method for working a first component and a second component that makes a reliable connection possible when at least one of the components comprises copper. It is also desirable to provide a device that makes possible a reliable connection of a component of copper on a further component.

SUMMARY

According to embodiments of the invention, a method for working a first component and a second component comprises providing the first component, which comprises a thermally sprayed electrically conductive layer. The second component, which has a longitudinally extended strip of copper, is provided. At least in a first region, the strip has a thickness transversely to the longitudinal direction of more than 0.1 mm. According to further embodiments, the strip has a thickness transversely to the longitudinal direction of more than 0.2 mm. According to further embodiments, the strip has a thickness transversely to the longitudinal direction of more than 0.3 mm. According to further embodiments, the strip has a thickness transversely to the longitudinal direction of more than 0.4 mm.

According to further embodiments, the strip has a thickness transversely to the longitudinal direction of more than 0.5 mm. According to further embodiments, the strip has a thickness transversely to the longitudinal direction of more than 0.6 mm. According to further embodiments, the strip has a thickness transversely to the longitudinal direction of more than 1 mm. According to further embodiments, the strip has a thickness of less than 2 mm. According to further embodiments, the strip has a thickness transversely to the longitudinal direction of more than 0.4 mm and less than 0.7 mm. The strip and the layer are arranged one on top of the other, so that the first region of the strip and the layer have a contact region in common with one another. A laser beam is emitted onto the contact region and a welded connection is thereby formed. The welded connection connects the strip and the layer to one another.

The strip, which comprises copper, is welded to the thermally sprayed electrically conductive layer. In this case it is possible to use a comparatively thick strip, which at least in the first region has a thickness transversely to the longitudinal direction of more than 0.1 mm. Use of the relatively thick strip makes it possible to ensure a sufficient current-carrying capacity of the strip even in the case of high-voltage applications in motor vehicles, for example of more than 100 V. During operation, the strip and/or the layer and/or the connection of the strip to the layer is formed so as to make it possible for a current of in particular at least 15 amperes, in particular a current of at least 20 amperes, in particular a current of at least 25 amperes, in particular a current of at least 30 amperes, to flow reliably between the strip and the layer. At least in a certain region, the strip has for example a cross-sectional area of more than 1.5 square millimeters, in particular a cross-sectional area of more than 2 square millimeters, in particular a cross-sectional area of 2.5 square millimeters or more than 2.5 square millimeters. The contact region, in particular the welded connection, between the strip and the layer is for example 16 square millimeters in size. In particular, the contact region or the welded connection is greater than 10 square millimeters, in particular greater than 15 square millimeters. As a difference from welding a thin wire with a cross section of for example less than 1 square millimeter onto a small contact region for a current flow of for example less than 1 ampere, the welding of the strip of copper is less susceptible to faults and has greater process tolerances. According to embodiments, the thermally sprayed electrically conductive layer has a thickness transversely to the longitudinal direction that corresponds to the thickness of the strip in the first region or is thinner than the strip.

The strip is used in particular as an electrical and/or mechanical contact interface with respect to the thermally sprayed electrically conductive layer. That the strip is of copper means for example that the strip may be formed from pure copper. That the strip is of copper also means for example that the strip consists predominantly of copper and also comprises further admixtures and/or impurities of other materials.

For example, the strip comprises at least 80% copper, for example at least 90% copper, for example at least 95% copper. By means of the strip it is possible to apply a voltage to the thermally sprayed electrically conductive layer. For example, the thermally sprayed electrically conductive layer is a contact area of a heating conductor. The heating conductor is for example part of a mobile heater, in particular for a motor vehicle. The heater has further layers, for example a substrate, arranged on that an adherend surface, arranged on that an insulation, arranged on that the heating conductor. The heating conductor comprises an electrically conductive metal, in particular nickel-chromium (NiCr). According to embodiments, the heating conductor is produced by a thermal spraying method.

The thermally sprayed conductive layer is for example applied by means of a thermal spraying of copper. Consequently, the method offers a possibility of welding the strip of copper onto the thermally sprayed layer, which comprises copper. This has the result in particular that a pure copper/copper connection is formed. No filler materials are necessary. In the case of a conventional soldering method, on the other hand, filler materials are necessary, and over the time in service may lead to embrittlement. This has the result that a reliable connection is accomplished by the welded connection of the strip and the thermally sprayed layer. In particular, the strip is connected to the thermally sprayed conductive layer in a gas-tight and/or material-bonded manner.

The material-bonded connection of the strip on the thermally sprayed layer has the effect that a gas impermeability and/or a moisture resistance of the conductive layer is made possible. Use of the strip of copper also makes a long-term thermal stability possible, in particular since copper has very good heat conducting properties. The laser beam is in particular emitted only for a relatively short welding time, in particular in the range of several milliseconds, in particular more than 1 millisecond and less than 10 milliseconds, for example less than 5 milliseconds. This has the result that the welded connection is reliably formed. In this case, undesired damage to further layers of the first component is reliably avoided.

According to further embodiments, the laser beam is emitted such that the geometrical form of the welded connection is annular. According to further embodiments, the laser beam is emitted such that the geometrical form of the welded connection is linear. According to further embodiments, the laser beam is emitted such that the geometrical form of the welded connection is rectangular. According to further embodiments, the laser beam is emitted such that the geometrical form of the welded connection is formed as circular. According to further embodiments, the laser beam is emitted such that the geometrical form of the welded connection is formed as punctiform. Further forms that make a reliable connection possible between the strip and the layer are also possible. In particular, different geometrical forms of the welded connection within a welded connection are possible. The choice of the geometrical form, in particular as annular, makes it possible for the laser beam to be reliably coupled into the strip of copper. Also made possible is a sufficiently large region for the melt of the welded connection, which makes a reliable electrical and mechanical coupling of the two components possible, in particular by means of a material-bonded connection.

For example, a laser beam in the infrared range is used, for example with a wavelength of 1064 nm. According to further embodiments, a laser in the green range is used, for example with a wavelength of 532 nm. According to further embodiments, a mixed form of laser is used, for example in the infrared range and in the green range, which has in particular the wavelengths of 1064 nm and 532 nm. The wavelength of the laser beam used is in particular prescribed so as to achieve coupling of the laser beam into copper that is as good as possible. Attention is also paid to a low susceptibility to faults or to the size of the process windows. In this way it is possible for as few defects as possible to form. The laser beam is produced for example by an NdYAg laser. In particular, the laser beam is produced by a fiber laser. The laser energy is chosen, for example in dependence on the wavelength used, such that only the strip is melted by the laser beam. The melting zone spreads from the strip such that the thermally sprayed electrically conductive layer likewise melts. The materials of the strip and of the layer mix and solidify to form a material-bonded connection. In particular on account of a small melt and a short melting time, it is possible to weld two elements of copper to one another.

Laser parameters for the laser beam comprise the wavelength used, the emission time and/or the power output. The laser parameters alternatively or additionally comprise the geometrical form of the welded connection or the beam guidance of the laser beam necessary for this. Furthermore, the laser parameters comprise the type of laser; in particular, a continuous-wave laser beam or a pulsed laser beam is used.

According to embodiments, the laser beam is first emitted with first laser parameters and subsequently emitted with second laser parameters that are different from the first laser parameters. The first laser parameters are for example prescribed such that the strip is preheated. Alternatively or additionally, the first laser parameters are for example prescribed such that a surface of the strip is roughened. Alternatively or additionally, the first laser parameters are prescribed such that the surface of the strip is cleaned, for example such that an oxide is removed, in particular an oxide layer. The second laser parameters are prescribed such that the material of the strip melts and the layer is likewise melted, so that the welded connection forms.

According to further embodiments, the laser beam is emitted obliquely. The oblique emission of the laser beam at an angle of greater than 0° and less than 90° in relation to the surface of the strip makes it possible to couple the laser beam well into the strip. It is also possible to avoid instances of damage being caused by undesired reflections at the optics of the laser.

The thermally sprayed layer is for example produced by means of an atmospheric plasma spraying method. The layer has in particular been applied to a stack of layers comprising at least a heating conductor layer and an insulating layer.

According to further embodiments, the thickness is reduced in a welding region of the first region of the strip. The welded connection is formed in the welding region. In particular, the thickness in the welding region is reduced to a prescribed second thickness transversely to the longitudinal direction. The second thickness is prescribed in dependence on a thickness of the thermally sprayed electrically conductive layer.

This makes it possible to form the thickness of the welding region less than or equal to the thickness of the thermally sprayed electrically conductive layer. As a result, it is possible to reduce the energy requirement of the laser beam. This allows the avoidance of faults that are caused by welds that are too deep. The layers that lie under the thermally sprayed electrically conductive layer are consequently spared during the welding. Outside the welding region, the thickness remains more than 0.1 millimeter, in order to accomplish good heat removal. In the welding region, the thickness is smaller, in order to make a dependable connection of the strip and the thermally sprayed electrically conductive layer possible. The thickness of the welding region is brought in particular into an optimum relationship with the thickness of the thermally sprayed electrically conductive layer in order to make reliable welding possible.

The thickness of the welding region is reduced for example by a stamping method and/or a rolling method and/or a milling method and/or a grinding method and/or a pressing method. Some other method that is suitable for reducing the thickness may also be used.

According to a further aspect of the invention, a device comprises a thermally sprayed electrically conductive layer. The device has a strip of copper, which at least in a first region has a thickness transversely to the longitudinal direction of more than 0.1 mm. According to further embodiments, the first region of the strip has a thickness transversely to the longitudinal direction as described above in connection with the method. The device has a welded connection, which connects the layer and the first region of the strip to one another in order to form by means of the strip an electrical and/or mechanical contact with respect to the layer.

The device is for example a heater or part of a heater. The heater is for example a heater for a motor vehicle, in particular a heater for engine-independent heating and/or engine-dependent heating of a motor vehicle. The heater is an electrical heater, in particular a resistance heater. For the electrical contacting of the heating conductor layer, which heats up when an electrical voltage is applied, the thermally sprayed electrically conductive layer has been applied to the heating conductor layer. The thermally sprayed electrically conductive layer serves as a contact pad of the heating conductor layer. The thermally sprayed electrically conductive layer comprises in particular thermally sprayed copper. The strip of copper has been welded onto the contact pad and during operation is coupled to a voltage source. The device consequently has for the electrical contacting a welded connection between the strip of copper and the thermally sprayed electrically conductive layer, which in particular likewise comprises copper.

According to further embodiments, the strip has a second region outside the welded connection. The strip has in the second region a thickness transversely to the longitudinal direction that is greater than the thickness in the first region. The thickness of the strip in the regions is prescribed in particular in dependence on functions of the regions that are primarily to be performed. In the first region, the thickness is prescribed primarily with a view to good weldability. In the second region, the thickness is for example prescribed primarily with a view to good current-carrying capacity and/or thermal stability.

According to further embodiments, the strip has in a welding region of the first region a second thickness that is less than the thickness. The welded connection is formed in the welding region. In particular, the second thickness is prescribed in dependence on a thickness of the thermally sprayed electrically conductive layer.

Consequently, the thickness of the welding region is less than or equal to the thickness of the thermally sprayed electrically conductive layer. As a result, it is possible to reduce the energy requirement of the laser beam during production. This allows the avoidance of faults that are caused by welds that are too deep. The layers that lie under the thermally sprayed electrically conductive layer are consequently spared during the welding. Outside the welding region, the thickness remains more than 0.1 millimeter, in order to accomplish good heat removal. In the welding region, the thickness is smaller, in order to make a dependable connection of the strip and the thermally sprayed electrically conductive layer possible. The thickness of the welding region is brought in particular into an optimum relationship with the thickness of the thermally sprayed electrically conductive layer in order to make reliable welding possible.

According to embodiments, a contour of the electrically conductive layer in projection in a stacking direction of the stack of layers is prescribed to avoid a buildup of heat at the electrically conductive layer. The contour is prescribed by at least one of the following:
 a prescribed width of a front side of the electrically conductive layer that is facing a middle region of the heating conductor layer,
 a prescribed distance from an isolation groove of the heating conductor layer, and
 a prescribed curvature of the contour.

According to further embodiments, in the projection in the stacking direction along the front side the prescribed curvature is prescribed by means of two prescribed radii for the front side that are different from one another.

According to further embodiments, the front side has in the projection in the stacking direction a straight-running portion.

According to further embodiments, the front side has in the projection in the stacking direction a concave portion and a convex portion.

According to further embodiments, in the projection in the stacking direction a width of the electrically conductive layer narrows from the width of the front side, at least in a partial region of the electrically conductive layer.

Further advantages, features and developments emerge from the following examples that are explained in conjunction with the figures. Elements that are the same, of the same type and have the same effect may be provided here with the same designations. The elements represented and their relative sizes in relation to one another should not in principle be regarded as to scale.

BRIEF DESCRIPTIONS OF THE DRAWINGS

Figure 2:
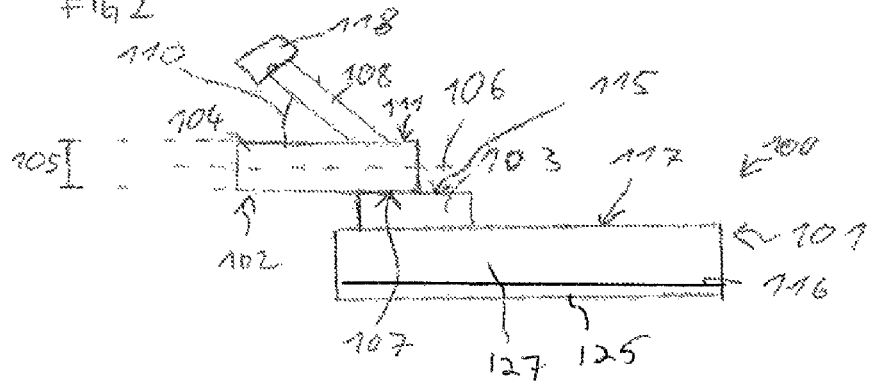
Figure 3:
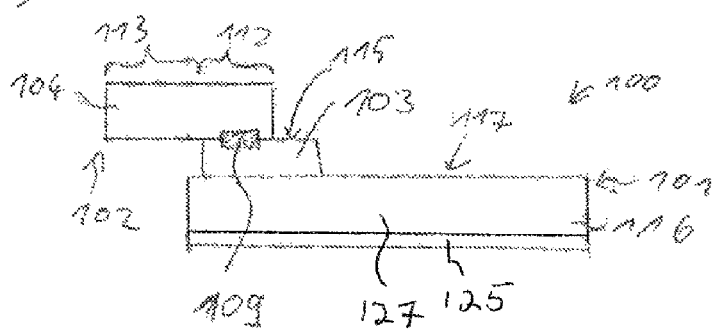
Figure 4:
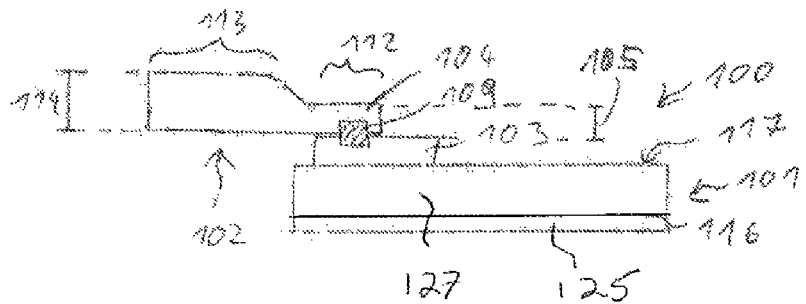

In the figures:

FIG. 1 shows a schematic plan view of a device according to embodiments,

FIG. 2 shows a schematic representation of a sectional view of the device according to embodiments, FIG. 3 shows a schematic representation of a sectional view of the device according to embodiments, FIG. 4 shows a schematic representation of a sectional view of the device according to embodiments, FIG. 5 shows a schematic plan view of a device according to embodiments, FIG. 6 shows a schematic representation of a sectional view of the device according to embodiments, and FIG. 7 shows a schematic representation of a sectional view of the device according to embodiments.

DETAILED DESCRIPTION

FIG. 1 shows a plan view of a device 100. The device 100 is in particular part of a heater for a motor vehicle. The heater is an electrical heater, which generates heat when a voltage is applied during operation.

The device 100 has a first component 101. The first component 101 has a stack of layers 116. The stack of layers 116 has a heating conductor layer 127 on an insulation layer 125. The stack of layers may have further layers, such as for example intermediate layers between the heating conductor layer 127 and the insulation layer 125.

On part of a surface 117 of the heating conductor layer, an electrically conductive layer 103 has been applied. The electrically conductive layer has been applied by means of a thermal spraying process, in particular by means of an atmospheric plasma spraying.

In particular, an arc is used, and an inert gas is passed through the arc. For example, compressed air is used. Copper powder is introduced and is melted as a result of the high plasma temperature. The stream of plasma entrains the powder particles and accelerates them onto the stack of layers 116. The electrically conductive layer 103 has for example a thickness 121 transversely to a longitudinal direction 106 of greater than 250 µm and less than 450 µm, for example 300 µm.

The electrically conductive layer 103 is formed from copper or comprises copper. For example, the electrically conductive layer comprises 99% copper. The copper has been applied to the stack of layers 116 by means of the thermal spraying process, so that there is an electrical connection between the electrically conductive layer 103 and the heating conductor layer. The electrically conductive layer 103 forms contact pads for the electrical and/or mechanical contacting of the stack of layers 116.

According to exemplary embodiments, the contour of the electrically conductive layer 103, in particular the outline in plan view of FIGS. 1 and 5, is prescribed such that current can be reliably introduced into the heating conductor layer during operation. The contour of the electrically conductive layer 103 is prescribed such that a uniform transport of current, and consequently a uniform heat distribution, are accomplished. This makes it possible to avoid buildups of heat (hot spots). According to embodiments, the width of the front edge or the front face of the electrically conductive layer 103 is prescribed such that a uniform transport of current, and consequently a uniform heat distribution, are accomplished. The front face or front edge is facing a middle region of the surface 117. Alternatively or additionally, the corners of the electrically conductive layer 103 are prescribed as rounded, in order to accomplish uniform transport of current, and consequently a uniform heat distribution. Alternatively or additionally, a distance from a neighboring isolation groove of the heating conductor layer is prescribed such that a uniform transport of current, and consequently a uniform heat distribution, are accomplished. The isolation groove serves in particular for dividing the heating conductor layer into conductor tracks. The prescribed contour of the contact pad that is formed by the electrically conductive layer 103 makes it possible to keep the temperatures at the contact pad so low during operation that reliable operation is accomplished in spite of a high flow of current.

Connected to the electrically conductive layer 103 in a material-bonded manner is a second component 102. The second component 102 has a strip 104 of copper. The strip 104 is for example formed from a copper alloy. The strip 104 of copper extends in an elongated manner along the longitudinal direction 106. The longitudinal direction 106 is for example that spatial direction along which the strip has its greatest extent.

During operation, two strips 104 and two layers 103 are provided. By means of the two strips 104, the device 100 can be connected to a current/voltage source. During operation, the two electrically conductive layers and the two strips 104 that are represented in FIG. 1 form for example the positive and negative terminals for the electrical voltage.

The strip 104 is respectively connected by means of a welded connection 109 to the electrically conductive layer 103. The welded connection 109 forms a mechanical and electrical connection between the strip 104 and the electrically conductive layer 103. The electrically conductive layer has a greater base area than the region of the strip 104 that is in contact with the electrically conductive layer 103. Consequently, during operation the temperature of the electrically conductive layer 103 is reduced in comparison with a contact layer of a size that corresponds substantially to the region of the strip 104 that is in contact with the electrically conductive layer.

In FIG. 1, the welded connection 109 is represented as circular. According to further embodiments, the welded connection has a different geometrical form, for example linear, rectangular and/or circular/punctiform. A mixture of different geometrical forms is also possible. In particular, according to embodiments, not just a single circle is provided for each welded connection 109, as represented in FIG. 1, but two or more welded connections spaced apart from and/or overlapping one another. For example, a lap fillet weld is provided as a welded seam arrangement.

FIG. 2 shows a sectional view of the device 100 during production. Formed on the surface 117 of the stack of layers 116 is the electrically conductive layer 103 of thermally sprayed-on copper. Placed on a surface 115 of the electrically conductive layer 103 that is facing away from the surface 117 is the strip 104. The strip 104 and the electrically conductive layer 103 consequently have in a first region 112 (FIG. 3) a common contact region 107. In the common contact region 107, the strip 104 and the electrically conductive layer 103 touch. The strip 104 and the electrically conductive layer 103 are placed one on top of the other as far as possible without any gaps. In the contact region 107, the copper of the strip 104 and the copper of the electrically conductive layer 103 are in direct contact with one another.

The strip 104 has a thickness 105 transversely to the longitudinal direction 106. The thickness 105 is chosen to be of such a size that a sufficiently great flow of current is possible during operation. For example, during operation a voltage of 100 V is applied to the strips 104 and there flows a current sufficiently great to make it possible for the device 100 to have a heating output sufficiently great for a motor vehicle. The thickness 105 is in particular greater than 0.1 mm and less than 0.6 mm. According to further embodiments, the thickness 105 is greater than 0.2 mm. According to further embodiments, the thickness 105 is greater than 0.3 mm. In particular, the thickness 105 is between 0.2 mm and 0.3 mm. According to further embodiments, the thickness 105 is between 0.4 mm and 0.6 mm. According to further embodiments, the thickness is greater than 0.5 mm, in particular greater than 1 mm. The thickness 105 is less than 5 mm, in particular less than 2 mm. The thickness 105 is chosen to be sufficiently thick to accomplish a sufficiently high current-carrying capacity. For example, the thickness 105 is chosen such that a current-carrying capacity of 25 A is accomplished.

A laser beam 108 is emitted by means of a laser 118 onto one side 111 of the strip 104. The side 111 is a surface that is facing away from the layer 103. The laser beam 108 is in particular emitted at an angle 110. The angle 110 is greater than 0°, in particular greater than 20°. The angle 100 is less than 90°, in particular less than 80°. The angle 110 is prescribed such that the laser beam 108 is coupled into the strip 104 as well as possible. The angle 110 is alternatively or additionally prescribed such that instances of damage to the laser caused by undesired reflections at the surface 111 are avoided.

According to embodiments, the laser 118 is a fiber laser. In particular, the laser 118 is an Nd:YAG laser (neodymium-doped yttrium-aluminum-garnet laser). According to further embodiments, a different laser is used.

In particular, the laser 118 is designed to produce the laser beams 108 with a wavelength of 532 nm. According to further embodiments, alternatively or additionally the laser beam 108 is produced with a wavelength of 1064 nm. For example, both a laser beam with a wavelength of 532 nm and a laser beam with a wavelength of 1064 nm are emitted. The laser beam with 532 nm couples into the strip 104 particularly well. The laser beam with 1064 nm has a high energy input into the strip 104. The laser power of the laser beam 108 is prescribed such that the strip 104 melts in a certain region. For example, a laser energy of 400 W is chosen. The laser energy is absorbed at the surface 111 of the strip 104, or in the interior of the strip 104, and is chosen to be of such an intensity that the material of the strip 104 at least partially melts in the region 112. The melting zone spreads in the direction of the layer 103 to the extent that the electrically conductive layer 103 is also melted. The layer 103 is melted at least in a region that directly adjoins the surface 114. The materials of the strip 104 and of the layer 103 mix in the melt. Subsequently, the melt solidifies to form the material-bonded welded connection 109 (FIG. 3).

According to further embodiments, the surface 111 is pretreated before the laser beam 108 for the welding is emitted. The pretreatment serves in particular for cleaning and/or roughening the surface 111. The cleaning has the effect for example of removing an oxide layer from the surface 111. The roughening of the surface has the effect of improving the coupling of the laser beam 108 into the strip 104. The roughening has the effect that the proportion of the laser beam 108 that is reflected at the surface 111 is reduced. The proportion of the laser beam 108 that penetrates into the interior of the strip 104, or is absorbed by the strip 104, is increased. By means of the roughening it is possible to set the reflectance of the surface 111 to a desired value. In particular, the reflectance is reduced in comparison with a non-roughened surface such that a higher heat input is made possible during the welding. As a result, the coupling-in behavior of the laser beam 108 is improved. The roughened surface 111 has the effect that the proportion of the energy of the laser beam 108 that is absorbed by the strip 104 is increased.

The pretreatment of the surface 111 is performed in particular by using the laser beam 108. For the pretreatment, the laser parameters for the laser beam 108 are set such that the laser beam 108 does not melt the material of the strip 104, but it is only that the surface 111 is roughened. For example, a pulsed laser is used. Moreover, a circular beam guidance is used for the pretreatment. Alternatively or additionally, the pretreatment is performed mechanically, for example by brushing. Alternatively or additionally, the pretreatment is performed chemically, for example by a superficial etching of the surface 111.

According to further embodiments, for the pretreatment before the welding, the strip 104 is alternatively or additionally preheated at least in the region 112. For the preheating, in particular the laser beam 108 is used with correspondingly prescribed laser parameters. The preheating has the effect for example of further improving the coupling of the laser beam 108 into the strip 104 during the welding.

Different laser parameters for the laser beam 108 are prescribed for the welding than for the pretreatment. For example, a continuous-wave laser beam 108 is used for the welding. For example, a top-hat (cylinder shape) and/or rectangular fiber is used as the grade of beam. The grade of beam or the beam profile is prescribed such that the material of the strip 104 is melted, in particular for example without any material being removed by burning. In particular, a comparatively small melting zone is formed and comparatively short melting times are prescribed. As a result, a welding of the strip 104 and of the layer 103 that respectively comprise copper is possible. It is possible in this case to dispense with filler materials. For example, the number and form of the welded connections 109 is chosen such that they correspond to an analogous wire cross section of 2.4 mm². This makes it possible to apply the strip 104 of copper on the thermally sprayed copper layer 103. A current-carrying capacity of 25 A is in this case ensured.

FIG. 4 shows the device 100 according to further embodiments. The device 100 corresponds substantially to the exemplary embodiments as explained in conjunction with FIGS. 1 to 3. As a difference, the strip 104 has in a second region 113 a second thickness 114. The second thickness 114 is greater than the thickness 105. The second region 113 is different from the first region 112 and is arranged outside the contact region 107. The thickness in the region 112, in which the strip 104 is welded to the layer 103, is smaller than the thickness 114 in the region 113, which is facing the current/voltage source during operation. This makes it possible to accomplish a welded connection 109 that is as good as possible in the region 112. At the same time, a current-carrying capacity that is as good as possible is accomplished in the region 113.

FIGS. 4 to 7 show the device 100 according to further embodiments. The device 100 corresponds substantially to the exemplary embodiments as explained in conjunction with FIGS. 1 to 3. As a difference, the strip 104 has in the first region 112 a welding region 119. The welding region 119 has a thickness 120 transversely to the longitudinal direction 106. The thickness 120 is smaller than the thickness 105. Outside the welding region 119, the strip 104 has in the first region 112 the thickness 105, which is greater than 0.1 millimeter.

The thickness 105 is reduced to the thickness 120 for example by a stamping method and/or a rolling method and/or a milling method and/or a grinding method and/or a pressing method. Some other method that is suitable for reducing the thickness may also be used.

The thickness 105 is chosen such that a good current-carrying capacity and a good thermal conductivity are accomplished. The region of the device 100 of the layer 103 is not heated during operation. The region of the device 100 of the layer 103 is in particular cooled by the medium flowing under this region. As a result of this cooling, in this region the smaller thickness 120 is sufficient for the load currents occurring. In the other regions, in particular outside the welding region 119, the thickness 105 is greater than in the welding region 119, in order to ensure sufficient removal of heat for the load currents occurring.

The welded connection 109 is consequently formed at the welding region 119 with the smaller thickness 120. As a result, it is possible to operate the laser beam 108 with a lower energy requirement. Welds that are too deep and damage the layer 103 can consequently be avoided. As a result, it is possible to reduce the number of reject parts during production.

The thickness 120 is in particular prescribed in dependence on the thickness 121 of the layer 103 transversely to the longitudinal direction 106. The greater the thickness 121 is, the greater for example the maximum value for the thickness 120 is prescribed. The smaller the thickness 121 is, the smaller for example the maximum value for the thickness 120 is prescribed. In particular, the thickness 120 is less than or equal to the thickness 121 of the layer 103. The thickness 121 is for example greater than 50 micrometers and less than 450 micrometers, in particular 200 micrometers or 300 micrometers.

The strip 104 consequently has at least two different thicknesses 105 and 120. As a result, the strip 104 has a sufficient removal of heat and is reliably weldable.

A combination is also possible with the exemplary embodiment of FIG. 4, in which the second region 113 has the greater thickness 114 than the first region 112 and the first region 112 has the welding region, which has the reduced thickness 120.

The strip 104 of copper according to the exemplary embodiments of FIGS. 1 to 7 has a sufficiently high current-carrying capacity to be used as a contact for a heater in a motor vehicle. The welded connection of the strip 104 to the layer 103 provides a gas-impermeable and moisture-resistant material-bonded connection. In this case, the porous material of the layer 103 is covered by the solid material of the strip 104 and/or the material-bonded connection 109. Short welding times in the range of milliseconds are possible for the forming of the welded connection 109. Consequently, a connection of the strip 104 to the layer 103 is reliably possible and undesired influencing of the stack of layers 101, for example damage, is avoided. A reliable connection between the strip 104 and the layer 103 over the service life of the device is made possible by the welded connection 109.

The invention claimed is:

1. A method for working a first component and a second component, comprising:
   providing the first component, which comprises a layer stack having
      an insulation layer on a heat conducting layer; and
      a separately formed thermally sprayed electrically conductive layer formed on a surface of the heat conducting layer,
      wherein the thermally sprayed electrically conductive layer is a contact pad of the heat conducting layer for a motor vehicle,
   providing the second component, which has a longitudinally extended copper strip, which at least in a first region has a first thickness transversely to the longitudinal direction of more than 0.1 millimeter,
   arranging the copper strip and the electrically conductive layer one on top of the other, so that the first region of the strip and the electrically conductive layer have a contact region in common with one another,
   emitting a laser beam onto the contact region; and thereby forming a welded connection, which connects the strip and the electrically conductive layer to one another,
   wherein the first thickness of the copper strip at the area where the welded connection is formed is less than a thickness of the thermally sprayed electrically conductive layer;
   wherein along a vertical stacking direction, the following are arranged one above the other in the following order: the insulation layer, the heat conducting layer, the thermally sprayed electrically conductive layer, and the copper strip;
   wherein the strip has a first portion which is arranged with a vertical overlap above the layer stack and a second portion which is arranged outside of the vertical overlap above the layer stack; and
   wherein the second portion is longer than the first portion.

2. The method according to claim 1, in which the laser beam is emitted such that the geometrical form of the welded connection is formed as annular, linear, rectangular or circular.

3. The method according to claim 1, in which the laser beam is emitted with first laser parameters and is subsequently emitted with second laser parameters that are different from the first laser parameters and are prescribed such that the welded connection is formed.

4. The method according to claim 1, in which the laser beam is emitted obliquely.

5. The method according to claim 1, in which the laser beam is emitted onto the strip on a side that is facing away from the electrically conductive layer.

6. The method according to claim 5, wherein provision of the second component comprises the step of roughening the side of the strip that is facing away from the layer by means selected from the list consisting of the laser beam, chemically, mechanically, and combinations thereof.

7. The method according to claim 1, wherein the provision of the first component comprises the step of thermally spraying copper to form the electrically conductive layer.

8. The method according to claim 1, wherein the provision of the second component comprises the step of reducing the first thickness in a welding region of the first region of the strip, and forming the welded connection in the welding region.

9. The method according to claim 8, wherein the step of reducing the first thickness in the welding region comprises reducing to a prescribed second thickness transversely to the longitudinal direction, the second thickness being prescribed in dependence on a thickness of the thermally sprayed electrically conductive layer.

10. A device, comprising:
    a component, which comprises a layer stack having
       an insulation layer on a heat conducting layer; and
       a separately formed thermally sprayed electrically conductive layer formed on a surface of the heat conducting layer,
    wherein the thermally sprayed electrically conductive layer is a contact pad of the heat conducting layer for a motor vehicle,
    a copper strip, which at least in a first region has a first thickness transversely to the longitudinal direction of more than 0.1 millimeter, and a welded connection, which connects the electrically conductive layer and the first region of the copper strip to one another in order to form by means of the copper strip a contact selected from the list consisting of electrical, mechanical, and a combination thereof with respect to the electrically conductive layer, and
    wherein the first thickness of the copper strip at an area where the welded connection is formed is less than a thickness of the thermally sprayed electrically conductive layer;
    wherein along a vertical stacking direction, the following are arranged one above the other in the following order: the insulation layer, the heat conducting layer, the thermally sprayed electrically conductive layer, and the copper strip;
    wherein the copper strip has a first portion which is arranged with a vertical overlap above the layer stack and a second portion which is arranged outside of the vertical overlap above the layer stack; and
    wherein the second portion is longer than the first portion.

11. The device according to claim 10, in which the strip has a second region outside the welded connection, the strip having in the second region a second thickness transversely to the longitudinal direction that is greater than the first thickness in the first region.

12. The device according to claim 10, in which the thermally sprayed electrically conductive layer comprises copper.

13. The device according to claim 10, in which: the strip has in a welding region of the first region a second thickness that is less than the first thickness, and the welded connection is formed in the welding region.

14. The device according to claim 13, in which: the third thickness is prescribed in dependence on a thickness of the thermally sprayed electrically conductive layer.

15. The device according to claim 10, wherein a contour of the electrically conductive layer being prescribed to avoid a buildup of heat at the electrically conductive layer, by at least one of the following: a prescribed width of a front side of the electrically conductive layer that is facing a middle region of the heating conductor layer, a prescribed distance from an isolation groove of the heating conductor layer, and a prescribed curvature of the contour.

\* \* \* \* \*